(12) United States Patent
Nakano et al.

(10) Patent No.: US 6,692,894 B1
(45) Date of Patent: Feb. 17, 2004

(54) PHOTOLITHOGRAPHIC PATTERN-FORMING MATERIAL AND METHOD FOR FORMATION OF FINE PATTERN THERWITH

(75) Inventors: Takashi Nakano, Tsukuba (JP); Masashi Kuwahara, Tsukuba (JP); Junji Tominaga, Tsukuba (JP); Nobufumi Atoda, Tsukuba (JP)

(73) Assignee: Agency of Industrial Science and Technology, Tokyo-To (JP)

( * ) Notice: Subject to any disclaimer, the term of this patent is extended or adjusted under 35 U.S.C. 154(b) by 31 days.

(21) Appl. No.: 09/651,730

(22) Filed: Aug. 30, 2000

(30) Foreign Application Priority Data

Aug. 30, 1999 (JP) .......................... 11-242778

(51) Int. Cl.⁷ ................................. G03F 7/00
(52) U.S. Cl. .................. 430/273.1; 430/271.1; 430/272.1
(58) Field of Search .............. 430/273.1, 271.1, 430/272.1

(56) References Cited

U.S. PATENT DOCUMENTS 6,329,036 B1 * 12/2001 Kikukawa et al. ......... 428/64.1
6,348,251 B1 * 2/2002 Tsai et al. .................. 428/64.1

FOREIGN PATENT DOCUMENTS

| JP | 7-106229 | 4/1995 |
| JP | 8-179493 | 7/1996 |
| JP | 8-248641 | 9/1996 |
| JP | 9-7935 | 1/1997 |
| JP | 10-326742 | 12/1998 |

OTHER PUBLICATIONS

Smolyaninov et al, "Near–field direct–write ultraviolet lithography and shear force microscopic studies of the lithographic process", Appl. Phys. Lett. 67(26), Dec. 25, 1995, American Institute of Physics, pp. 3859–3861.*

Davy et al, "Near field optics: Snapshot of the field emitted by a nonsource using a photosensitive polymer", Appl. Phys. Lett. 69 (22), Nov. 25, 1996, American Institute of Physics, pp. 3306–3308.*

Herndon et al, Near–field scanning optical naonlithography using amorphous silicon photoresists, Applied Physics Letters, vol. 74, No. 1, Jan. 4, 1999, pp. 141–143.*

* cited by examiner

Primary Examiner—Cynthia Hamilton

(57) ABSTRACT

Disclosed is a photolithographic pattern-forming material capable of giving a fine patterned resist layer rapidly and being used repeatedly. The pattern-forming material is a multilayered body comprising a substrate and a photoresist layer thereon which is overlaid with a three-layered composite film for near-field light generation consisting of an intermediate layer of a non-linear optical material such as antimony sandwiched between two dielectric layers. When irradiated with active rays focused on the optically nonlinear layer, a fine optical window or light scattering point is formed therein where a near-field light is generated to pattern-wise expose the photoresist layer.

8 Claims, 5 Drawing Sheets

PHOTOLITHOGRAPHIC PATTERN-FORMING MATERIAL AND METHOD FOR FORMATION OF FINE PATTERN THERWITH

BACKGROUND OF THE INVENTION

The present invention relates to a photolithographic patterning material and a method for the formation of a fine pattern by using the same. More particularly, the invention relates to a multilayered photolithographic patterning material and a photolithographic method for the formation of a fine pattern therewith by utilizing a near-field light.

As is known, the photolithographic fine patterning is a well established and widely practiced technology in the manufacture of a great variety of electric and electronic parts including semiconductor silicon-based LSIs and originals of optical disks. It is a requirement in this field of technology to accomplish more and more increased fineness of patterning in order to comply with the rapid increase in the quantity of accumulated information recording and in the information-processing quantity.

The photolithographic patterning process currently undertaken is conducted by exposing a photosensitive resist layer formed on a substrate with active rays through a pattern-bearing photomask to form a latent image of the pattern which is then developed by using a developer solution. A factor limiting the minimum dimension of the thus formed resist pattern is diffraction of the light so that the minimum dimension actually accomplished in practice can be only slightly smaller than the wavelength of the light used in the pattern-wise exposure of the photoresist layer. Needless to say, the diffraction limit depends on the wavelength of the light and the numerical aperture of the lens system used for the light exposure and the limit value can be decreased as the wavelength of the light is decreased and as the numerical aperture of the lens system is increased. Since it is technologically an extremely difficult matter to design a lens system having a numerical aperture exceeding the value of current lens systems, the development works to accomplish further increased fineness of photolithographic patterning are exclusively directed to the utilization of light having a shorter and shorter wavelength.

Accordingly, intensive investigations are now under way to develop a novel patterning exposure technology by employing deep ultraviolet light, electron beams, laser beams, soft X-rays and the like. Needless to say, the technology for obtaining a line-and-space patterned photoresist layer having a line width of 100 nm or finer cannot be accomplished without solving various peripheral problems such as development of high-performance light sources and improvement in the performance of the optical materials and photoresist compositions.

On the other hand, an alternative approach to this problem is now receiving attention for accomplishing photolithographic patterning of a photoresist layer with fineness not attained by the conventional methods utilizing a near-field light which is inherently free from the limitation of light diffraction. For example, a method is proposed that a near-field probe having a microaperture of several tens of nanometers is provided at the sharpened end point of an optical fiber and the near-field probe is brought near to the surface of a photoresist layer on which a pattern is drawn by the near-field light going to the microaperture through the optical fiber (see Japanese Patent Kokai 7-106229, 8-248641 and 10-326742).

In this method, however, the surface of the photoresist layer must be scanned over a substantial area with the near-field probe under control of the near-field probe at a distance of only several tens of nanometers from the surface of the photoresist layer taking a long time for scanning. Since this scanning is performed by using a stage having a large number of piezoelectric elements with a few nanometer resolution, moreover, the range which can be patterned at one time is limited to be several micrometers to several tens of micrometers so that wide-range writing is practically impossible and, in addition, the photosensitive material must have a particularly high photosensitivity due to the low utilization efficiency of light in the microaperture.

A further proposal is made in Japanese Patent Kokai 8-179493 for a method in which a photomask bearing a fine pattern is laminated onto the surface of the photosensitive material either directly or with intervention of a gap layer to be exposed to the near-field light. This method, however, has a problem that, when pattern-wise exposure is desired over a wide area by this method, the pattern-bearing photomask must be a large size one while such a large fine mask pattern can be prepared practically only with a great difficulty by imaging with electron beams over a wide area.

Besides, a method is disclosed in Japanese Patent Kokai 9-7935 in which a thin film of a non-linear optical material or, namely, a thin film of which the light transmittance is increased with the intensity of the incident light is brought into direct contact with the photoresist layer and the thin film is irradiated spotwise with light so as to effect a local increase in the light transmittance of the thin film forming a desired pattern in the thin film by the relative scanning of the light spot and the photoresist layer, through which the photoresist layer is pattern-wise exposed to light. By undertaking this method, it is possible to conduct direct imaging of a fine pattern below the diffraction limit with a laser beam and patterning at a high speed with a near-field light.

In this method, however, the thin film of a non-linear optical material is in direct contact with the photoresist layer so that the numerical aperture and the distance from the surface of the photoresist layer, each as a parameter determinant of the resolution with the near-field light, cannot be controlled not to give an option for the selection of the optimum exposure conditions for the near-field light. In addition, the light-induced changes in the non-linear optical material are irreversible so that multiple exposure or repeated exposure cannot be undertaken by using a single pattern-bearing photomask.

SUMMARY OF THE INVENTION

The present invention accordingly has an object, in order to overcome the above described problems and defects in the conventional photolithographic fine patterning methods by utilizing a near-field light, to provide a photolithographic patterning material suitable for the formation of a fine resist pattern over a wide area with a greatly increased speed and capable of being used repeatedly as well as to provide a method for photolithographic fine patterning of the resist layer by utilizing the patterning material.

Thus, the photolithographic patterning material provided by the present invention is a multilayered integral body which comprises:

(a) a substrate;

(b) a photosensitive resist layer formed on one surface of the substrate; and (c) a composite layer for generation of a near-field light, which is formed on the photoresist layer, consisting of
(c1) a first dielectric layer of a dielectric material in direct contact with the photoresist layer,
(c2) a layer of a non-linear optical material, and
(c3) a second dielectric layer of a dielectric material, the layer (c2) being sandwiched between the first dielectric layer (c1) and the second dielectric layer (c3).

Preferably, the first dielectric layer (c1) intervening between the photoresist layer (b) and the layer (c2) has a thickness not exceeding 150 nm and the layer (c2) of the non-linear optical material has a thickness in the range from 5 nm to 200 nm.

The method of the invention for photolithographic fine patterning of a photoresist layer by using the above defined photolithographic patterning material comprises the step of: exposing pattern-wise the photosensitive resist layer (b) to active rays through the composite layer (c) for generation of a near-field light.

In this method, in particular, the active rays are focused to the layer (c2) of a non-linear optical material to form an opening or a microspot of light scattering in which a near-field light is generated for image-forming exposure of the photoresist layer.

DETAILED DESCRIPTION OF THE PREFERRED EMBODIMENTS

In the following, a detailed description is given of the present invention by making reference to the accompanying drawings.

Figure 1A:
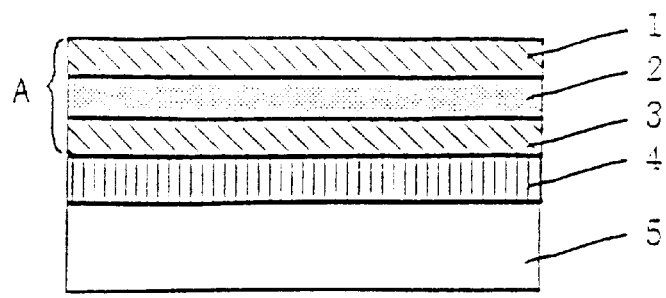
FIG. 1A is a vertical cross sectional view of the inventive photolithographic patterning material.
Figure 1B:
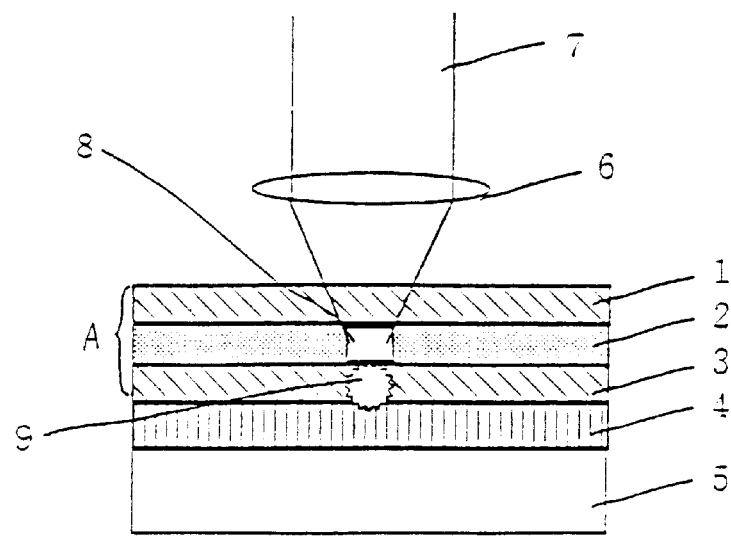
FIG. 1B is the same cross sectional view as above for illustration of the performance of the patterning material.

FIG. 1A is a cross sectional view showing the multilayered structure of the inventive fine patterning material and FIG. 1B is the same cross sectional view illustrating the performance of the composite film for near-field light generation under irradiation with active rays.

As is understood from these figures, the fine patterning material of the present invention is an integral multilayered body consisting of a substrate 5, a photosensitive resist layer 4 formed on the substrate 5, a first dielectric layer 3 formed on the photoresist layer 4, an intermediate layer 2 of a non-linear optical material formed on the first dielectric layer 3 and a second dielectric layer 1 formed on the intermediate layer 2. The three-layered body consisting of the first and second dielectric layers 3,1 sandwiching the intermediate layer 2 of a non-linear optical material is referred to as a composite film A hereinafter.

This multilayered patterning material is irradiated, as is illustrated in FIG. 1B, with active rays 7 through a condenser lens 6 to focus the active rays to the intermediate layer 2. Since the intensity distribution of the active rays follows the Gaussian distribution, the temperature increase in the composite film A is larger in the center area than in the peripheral area of the intensity distribution profile resulting in a change in the complex refractive index at the portion where the temperature exceeds the threshold value so that an optical window or an extremely fine scattering point 8 is formed in the optically non-linear layer 2, through which the light propagates to the first dielectric layer 3 where a fine near-field light spot 9 is generated. This near-field light spot 9 acts on the photosensitive resist layer 4 through the first dielectric layer 3 to exhibit the effect of light exposure. The diameter of the near-field light spot 9 can be controlled by means of the intensity of the incident active rays and the thickness of the first and second dielectric layers 3,1 so that the fineness of the pattern is free from the limitation due to diffraction of light in the lens system.

Since the changes induced in the optically non-linear layer 2 by heat is reversible, the patterning material can be used for multiple exposure or can be used for repeated exposure.

The material of the substrate 5 in the fine pattern-forming material of the invention is not particularly limitative and can be selected from those conventionally used as the substrate in the photolithographic technology including inorganic or metallic materials such as silicon, tantalum, aluminum, gallium arsenide and various kinds of glass materials and organic or polymeric materials such as polypropylenes, acrylic resins, polycarbonate resins, styrene-based resins and vinyl chloride-based resins. Further applicable substrates include inorganic substrates of aluminum, tantalum, silicon oxide and the like and glass substrates having a vapor-deposited coating film of aluminum, tantalum and the like or a coating layer of a photocurable resin composition.

The photoresist composition forming the photosensitive resist layer 4 is also not particularly limitative and can be selected from those conventionally used for photolithographic patterning in the manufacture of electronic devices including positive-working and negative-working photoresist compositions. It is preferable to use a photoresist composition of the chemical-amplification type developed for the purpose of fine pattern formation.

The chemical-amplification photoresist composition comprises, as the essential ingredients, a resinous compound which can be imparted with increased solubility in alkali in the presence of an acid and an acid-generating agent which can release an acid when irradiated with radiation. A great variety of formulations thereof are disclosed in Japanese Patent Kokai 5-346668, 7-181677, 10-97074, 10-171109, 10-207069, 11-15162 and 11-15158 and elsewhere with an object to accomplish improvements in the photosensitivity, pattern resolution, focusing depth latitude, storage stability and cross sectional profile of the patterned resist layer. Any one of these conventional chemical-amplification photoresist compositions can be used in the present invention.

Besides, non-chemical-amplification photoresist compositions can also be used in the invention containing an alkali-soluble novolak resin and a quinonediazido group-containing compound as the essential ingredients as disclosed in U.S. Pat. No. 4,377,631 and Japanese Patent Kokai 62-35449, 1-142548 and 1-179147 and those containing a nitrogen-containing heterocyclic polymer and a quinonediazide group-containing compound as the essential ingredients as disclosed in Japanese Patent Publication 1-46862 and Japanese Patent Kokai 4-46345.

Examples of suitable dielectric materials forming the first and second dielectric layers 3,1 sandwiching the optically non-linear layer 2 include ceramic materials such as silicon nitride SiN, silicon dioxide $SiO_2$, titanium dioxide $TiO_2$, barium titanate and solid solutions of barium titanate with lead titanate, strontium titanate, barium zirconate and barium stannate, Rochelle salt, potassium dihydrogenphosphate, thiourea, sodium nitrate and zinc sulfide, though not particularly limitative thereto.

The non-linear optical material forming the intermediate layer 2 between the dielectric layers 3,1 is a material which exhibits, when irradiated with a photon beam, polarization, phase change or chemical reaction in proportion to the square or cube of the intensity of the incident beam and is subject to occurrence of the phenomena such as changes in the refractive index, generation of higher harmonics, Pockels effect, Kerr effect and the like. Examples of non-linear optical materials suitable for use in the invention include metals such as antimony, alloys such as germanium/antimony/tellurium alloys, silver/indium/antimony/tellurium alloys and silver/indium/antimony/tellurium/vanadium alloys, and compounds such as silver oxide, lithium niobate and methyl nitroaniline. Thermochromic and photochromic organic materials can also be used as non-linear optical materials.

Each of the component layers 3,2,1 forming the composite film A for near-field light generation should have a thickness in a limited range. Namely, the first dielectric layer 3 between the photosensitive resist layer 4 and the optically non-linear layer 2 has a thickness not exceeding 150 nm or, preferably, in the range from 10 to 100nm. The optically non-linear layer 2 has a thickness in the range from 5 to 200 nm or, preferably, from 10 to 30 nm. The second dielectric layer 1 as the topmost layer has a thickness in the range from 100 to 250 nm.

When the thickness of the first dielectric layer 3 is increased to exceed the upper limit, the intensity of the near-field light reaching the photosensitive resist layer 4 is largely lowered due to an exponential decrease with the increase in the thickness of the first dielectric layer so that latent image formation cannot be complete. Since the second dielectric layer 1 plays a role merely as a protective film, the above mentioned range of thickness is only for typical cases and the thickness can be selected from a broader range in consideration of the balance between the protective effect and the decrease in the transmittance to the incident light.

When the thickness of the optically non-linear layer 2 is too large, on the other hand, the reaction leading to a change in the solubility of the photosensitive resin or a phase change thereof cannot fully proceed so that the pattern-wise exposure of the photosensitive resist layer 4 cannot be accomplished. When the thickness thereof is too small, the optical window necessary for the generation of a near-field light cannot be fully formed therein so that the near-field light cannot be generated with full stability.

The composite film A for near-field light generation can be provided on the photosensitive resist layer 4 by directly forming the layers 3, 2 and 1 successively or by attaching a separately prepared composite film consisting of the three layers 3, 2 and 1 onto the photosensitive resist layer 4.

Formation of each of the layers 3, 2 and 1 on the photosensitive resist layer 4 or on a separate base plate can be performed according to a known procedure either by a physical method such as vacuum vapor deposition method and sputtering method or by a chemical method such as the chemical vapor-phase deposition method. When the layer is formed from an alloy of a plurality of elements, the physical deposition procedure can be performed either with a target of the alloy prepared in advance or with targets of the respective component elements so as to form the alloy in the deposited film in situ.

It is optional that the fine pattern-forming material of the invention described above is provided, on top of the second dielectric layer 1, with a further protective layer of a transparent material such as a plastic resin and glass.

In the following, the method of the invention for the formation of a fine pattern in the photosensitive resist layer 4 of the above described fine pattern-forming material is described by making reference to the drawings.

Figure 2:
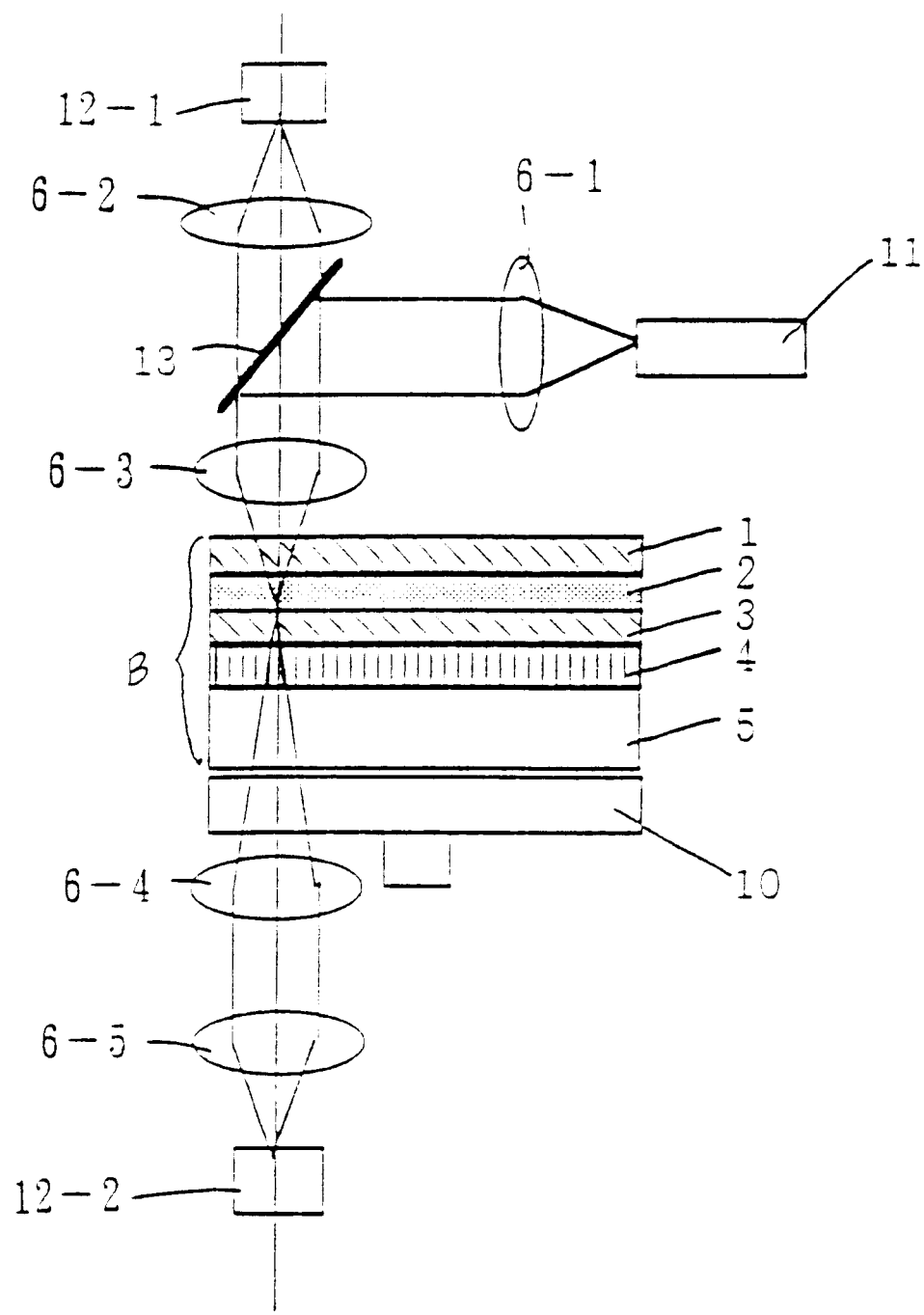
FIG. 2 is a vertical cross sectional view of the inventive patterning material for illustration of a working mode thereof.

FIG. 2 is given for illustration of a practicing mode of the inventive method for fine patterning by using the fine pattern-forming material B shown by a vertical cross section.

The fine pattern-forming material B is mounted on a rotary table 10. The active rays coming from the light source 11 through the first condenser lens 6-1 are divided at the semi-transparent mirror 13 into two directions, one, toward the first detector 12-1 through the second condenser lens 6-2 and, the other, toward the fine pattern-forming material B, which has the same layered structure as in FIG. 1A, on the rotary table 10 through the third condenser lens 6-3. The active rays passing and acting on the fine pattern forming material B reach the second detector 12-2 through the fourth and fifth condenser lenses 6-4 and 6-5.

The process of pattern drawing can be performed by linearly moving the exposure light beam from the center position to the peripheral position of the fine pattern-forming material B under high-speed revolution on the rotary table 10. Alternatively, the process of pattern drawing can be performed by scanning at a high speed in X- and Y-directions with the exposure light beam. The scanning speed in this case can be larger by 1000 times or more than in the conventional methods by utilizing a near-field probe or the stage scanning method by using a piezo element.

It is important in the method of the present invention to undertake control of focusing under continuous monitoring of the intensities of the incident active rays, reflecting light and transmitting light by means of the first and second detectors 12-1 and 12-2 in such a way that a near-field light spot 9 is optimized in the composite film B for near-field light generation.

The active rays for the pattern-wise exposure can be selected from a variety of active rays used in the photolithographic patterning works for the formation of a fine pattern including visible light, deep ultraviolet light, electron beams, i-line light, g-line light, KrF excimer laser beams and ArF excimer laser beams.

It is an advisable way in the inventive method that the composite film A for near-field light generation is irradiated from above with active rays with simultaneous irradiation with inactive rays which cause no effect on the photosensitive layer 4 from the same side or opposite side through the transparent substrate. When exposure to light is conducted in this dual way, the optically non-linear layer 2 is heated by the inactive rays and the heat is transferred to the photosensitive layer 4 to promote the chemical changes therein by the synergistic effect with the active rays.

In the method of the invention, active rays of a single kind can be used for simultaneously effecting formation of an opening or fine scattering point in the optically non-linear layer 2 and generation of a near-field light therein or, alternatively, inactive rays are used only for the formation of an optical window or fine scattering point in the optically non-linear layer 2 while active rays are used for the generation of a near-field light and the latent image formation in the photosensitive layer.

In the following, the present invention is described in more detail by way of Examples.

EXAMPLE 1

A dielectric layer of silicon nitride SiN having a thickness of 170 nm, a layer of antimony as a non-linear optical material having a thickness of 15 nm and another dielectric layer of silicon nitride having a thickness of 20 nm were successively formed in this order by the rf magnetron sputtering method on the surface of a glass plate to form a composite film for near-field light generation supported by the glass plate. The thus formed composite film was coated with a photoresist solution (OFPR-800, a product by Tokyo Ohka Kogyo Co.) by spin-coating followed by drying to form a photoresist layer having a thickness of 120 nm. The photoresist layer was overlaid with a 100 $\mu$ thick semiconductor silicon wafer followed by a prebaking treatment at 110° C. for 1 minute so that the silicon wafer and the photoresist layer were adhesively bonded firmly to give a fine pattern-forming material of which the composite film was protected with the glass plate.

The thus prepared pattern-forming material was mounted on the rotary table of the exposure machine illustrated in FIG. 2 (Model DDU-1000, manufactured by Pulstec Industrial Co.) and exposed to a semiconductor laser beam of 400 nm wavelength. The spot diameter of the laser beam on the antimony layer was about 0.6 $\mu$ as calculated from the wavelength. The rotary table was rotated at a constant linear velocity of 6 meters/second. The intensity of the semiconductor laser beam was 3 mW. After light exposure in this way for about 10 seconds, the pattern-forming material was subjected to a development treatment in a conventional method. The line-patterned resist layer thus formed had a width of 200 nm which was a half of the wavelength 400 nm of the active rays used for exposure.

The same procedure as above was repeated except that the thickness of the silicon nitride layer between the antimony layer and the photoresist layer was increased from 20 nm to 150 nm but patterning of the photoresist layer could not be obtained.

EXAMPLE 2

A glass plate was provided on the surface with a composite film for near-field light generation consisting of a silicon nitride layer of 170 nm thickness, an antimony layer of 15 nm thickness and another silicon nitride layer of 20 nm thickness, which was spin-coated with the same photoresist composition as used in Example 1 followed by drying to form a photoresist layer of 120 nm thickness. After a prebaking treatment on a hot plate at 110° C. for 1 minute, the photoresist layer was pressed against a glass plate to be firmly bonded thereto thus to give a fine pattern-forming material having a vertical cross sectional structure illustrated in FIG. 3.

Figure 4:
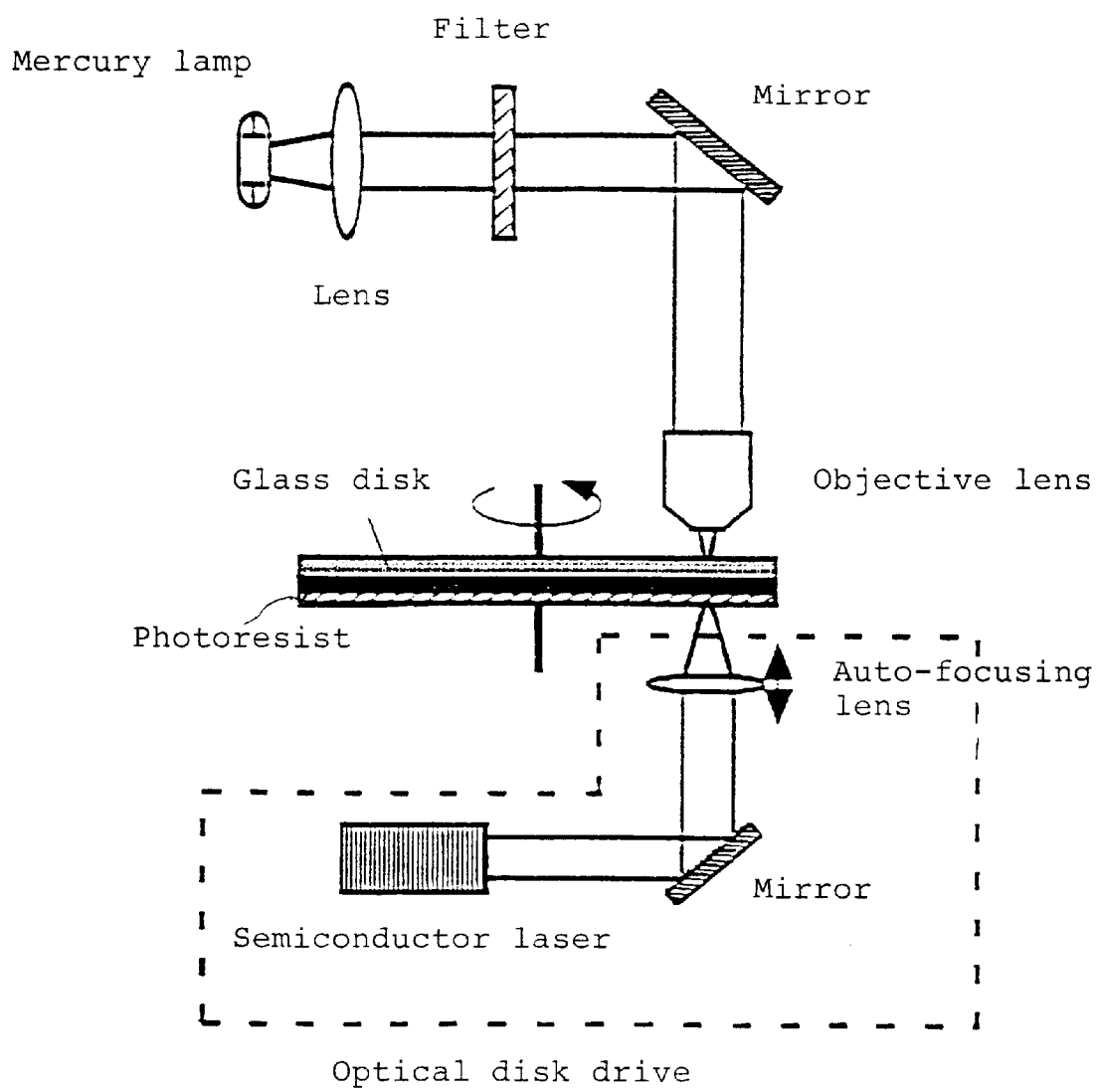
FIG. 4 is a schematic illustration of the unit for conducting pattern formation in Example 2.

The thus prepared fine pattern-forming material was mounted on the machine illustrated in FIG. 4 and irradiated through the photoresist layer with a semiconductor laser beam of 635 nm wavelength having an intensity of 3 mW and focused on the antimony layer. The semiconductor laser beam of 635 nm wavelength to which the photoresist is insensitive was used only to form an optical window in the antimony layer. Concurrently, irradiation was made to expose the photoresist layer with the i-line light of a several mW intensity from a mercury lamp which was focused on the rear surface of the glass substrate with an objective lens through a filter for a wavelength of 365 nm.

Figure 3:
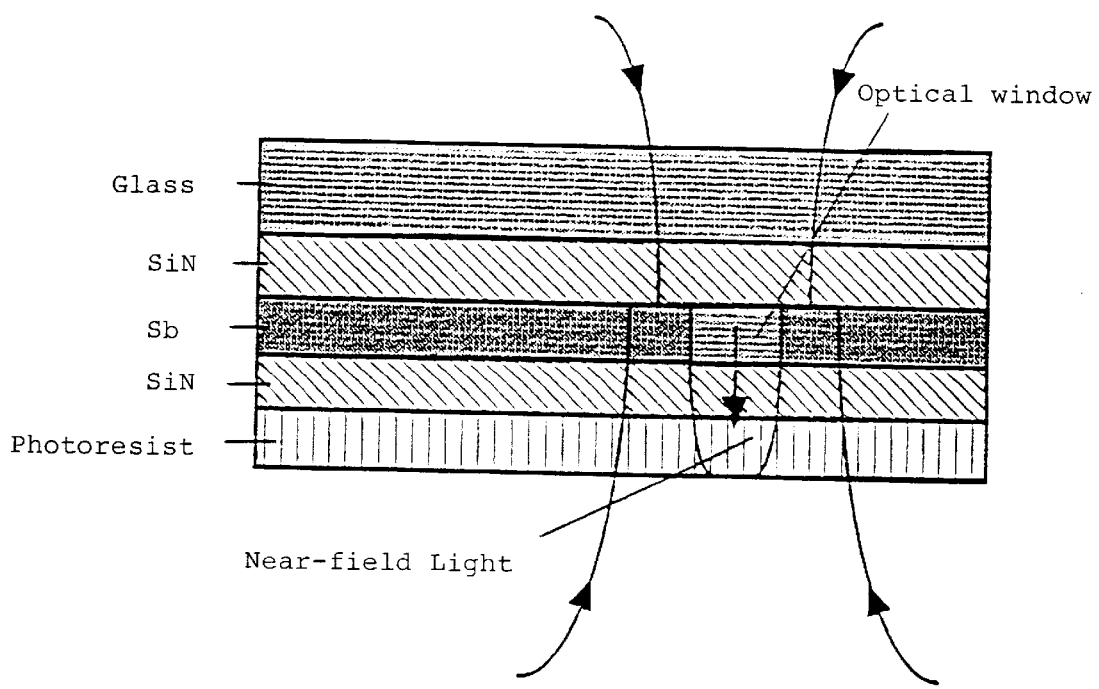
FIG. 3 is a vertical cross sectional view of the inventive patterning material prepared in Example 2 indicating the paths of active and inactive rays therethrough.

In FIG. 3, the curves with arrows coming from below and from above indicate the semiconductor laser beam and the i-line light from the mercury lamp, respectively.

Figure 5A:
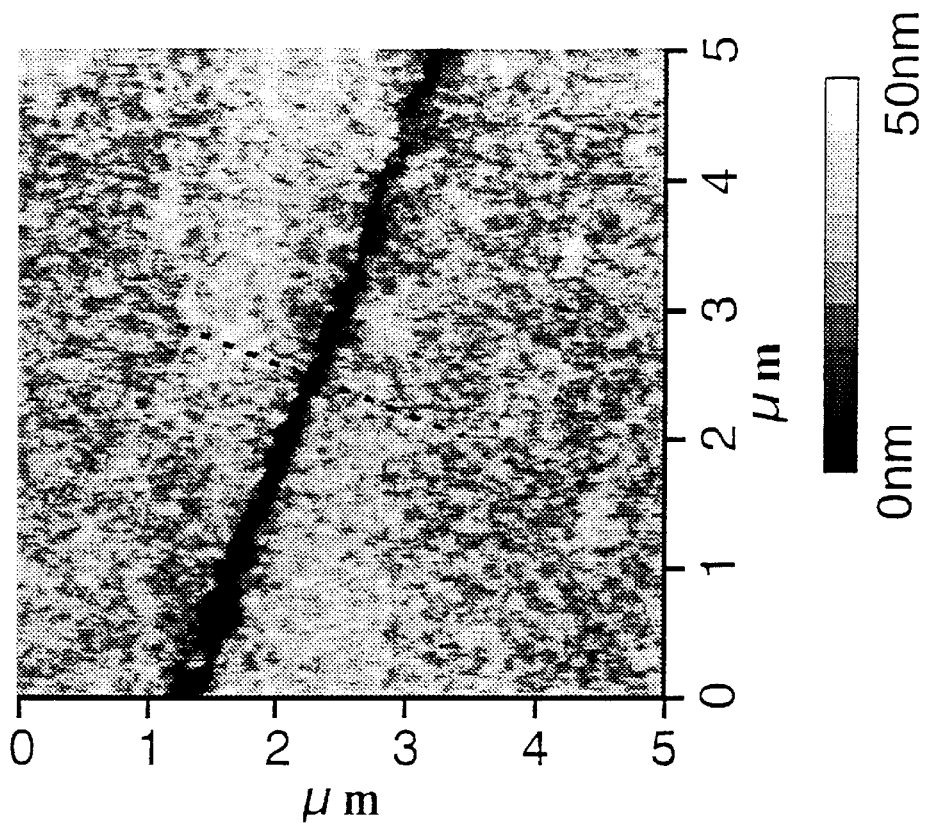
FIGS. 5A and 5B are a top view and an imaged cross sectional view, respectively, of the fine patterned layer obtained in Example 2 by atomic force microscopy.
Figure 5B:
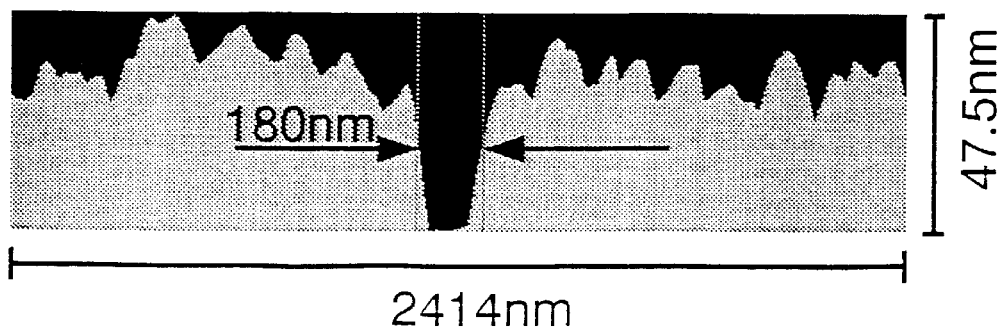

FIGS. 5A and 5B are a top view and a cross sectional view, respectively, of the thus patterned resist layer as imaged by the atomic force microscopic photographs. These figures show that a groove having a width of 180 nm and a depth of 35 nm is found in the layer.

What is claimed is:

1. A photolithographic pattern-forming material as a multilayered integral body which comprises:
   (a) a substrate;
   (b) a photosensitive layer formed on one surface of the substrate (a), said photosensitive layer formed from a chemical-amplification photoresist composition; and
   (c) a composite layer for generation of a near-field light, which is formed on the photosensitive layer (b), consisting of
      (c1) a first dielectric layer of a dielectric material, said layer having a thickness not exceeding 150 nm, in direct contact with the photosensitive layer (b),
      (c2) an intermediate layer of a non-linear optical material formed on the first dielectric layer (c1), and
      (c3) a second dielectric layer of a dielectric material formed on the intermediate layer (c2),
   the layer (c2) being sandwiched between the first dielectric layer (c1) and the second dielectric layer (c3).

2. The photolithographic pattern-forming material as claimed in claim 1 in which the dielectric material forming the first and second dielectric layers is selected from the group consisting of silicon nitride, silicon dioxide, titanium dioxide, barium titanate, solid solutions of barium titanate with lead titanate, strontium titanate, barium zirconate and barium stannate, Rochelle salt, potassium dihydrogenphosphate, thiourea, sodium nitrate and zinc sulfide.

3. The photolithographic pattern-forming material as claimed in claim 1 in which the non-linear optical material forming the intermediate layer (c2) is selected from the group consisting of antimony, germanium/antimony/tellurium alloys, silver/indium/antimony/tellurium alloys, silver/indium/antimony/tellurium/vanadium alloys, silver oxide, lithium niobate, methyl nitroaniline.

4. The photolithographic pattern-forming material as claimed in claim 1 in which the intermediate layer (c2) has a thickness in the range from 5 to 100 nm.

5. The photolithographic pattern-forming material as claimed in claim 1 in which the second dielectric layer (c3) has a thickness in the range from 100 to 250 nm.

6. A method for photolithographic patterning of a photosensitive layer by using the photolithographic pattern-forming material as defined in claim 1 which comprises irradiating pattern-wise the intermediate layer (c2) of a non-linear optical material with active rays.

7. The method for photolithographic patterning of a photosensitive layer as claimed in claim 6 in which the active rays are focused on the intermediate layer (c2) of a non-linear optical material to form an optical window or a light scattering point where a near-field light for pattern-wise exposure of the photosensitive layer is generated.

8. The method for photolithographic patterning of a photosensitive layer as claimed in claim 6 in which inactive rays are focused on the intermediate layer (c2) of a non-linear optical material to form an optical window or a light scattering point where a near-field light for pattern-wise exposure of the photosensitive layer is generated by irradiation with active rays.

* * * * *

UNITED STATES PATENT AND TRADEMARK OFFICE
CERTIFICATE OF CORRECTION

PATENT NO. : 6,692,894 B1  Page 1 of 1
APPLICATION NO. : 09/651730
DATED : February 17, 2004
INVENTOR(S) : Takashi Nakano It is certified that error appears in the above-identified patent and that said Letters Patent is hereby corrected as shown below:

On front page, left column, in item (73), please list the Assignees as follows:

(1) Japan as Represented by Secretary of Agency of Industrial Science and Technology, Tokyo-to (JP)

(2) Takeshi NAKANO, Tsukuba-shi (JP)

(3) Masashi KUWAHARA, Tsukuba-shi (JP)

(4) Junji TOMINAGA, Tsukbuba-shi (JP)

Signed and Sealed this

Thirty-first Day of July, 2007

JON W. DUDAS
*Director of the United States Patent and Trademark Office*